(12) United States Patent
Sel et al.

(10) Patent No.: US 7,084,440 B2
(45) Date of Patent: Aug. 1, 2006

(54) INTEGRATED CIRCUIT LAYOUT AND A SEMICONDUCTOR DEVICE MANUFACTURED USING THE SAME

(75) Inventors: Jong-Sun Sel, Seoul (KR); Hong-Soo Kim, Kyunggi-do (KR); Jung-Dal Choi, Kyunggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 6 days.

(21) Appl. No.: 10/376,465

(22) Filed: Feb. 28, 2003

(65) Prior Publication Data

US 2003/0227063 A1    Dec. 11, 2003

(30) Foreign Application Priority Data

Jun. 5, 2002  (KR) ............... 2002-31638

(51) Int. Cl.
*H01L 27/10*  (2006.01)
*H01L 29/73*  (2006.01)
*H01L 23/58*  (2006.01)
*H01L 29/76*  (2006.01)

(52) U.S. Cl. .................. 257/208; 257/210; 257/211; 257/314; 257/315; 257/316; 257/319

(58) Field of Classification Search .............. 257/208, 257/210, 211, 314, 315–319, 736, 748, 750, 257/774, 781; 438/128, 129, 598, 597, 599, 438/618; 365/51, 63, 230.06
See application file for complete search history.

(56) References Cited

U.S. PATENT DOCUMENTS

| | | | |
|---|---|---|---|
| 6,545,892 B1* | 4/2003 | Takano et al. | 365/51 |
| 6,713,886 B1* | 3/2004 | Kumagai et al. | 257/390 |
| 2003/0062550 A1* | 4/2003 | Sekiguchi et al. | 257/208 |

OTHER PUBLICATIONS

Syd R. Wilson, Clarence J. Tracy, and John L. Freeman, Jr., "Handbook of Multilevel Metallization for Integrated Circuits," Noyes Publ., Westwood, New Jersey, (1993), p. 675.*

* cited by examiner

*Primary Examiner*—Nitin Parekh (74) *Attorney, Agent, or Firm*—Marger Johnson & McCollom, P.C.

(57) ABSTRACT

An integrated circuit layout and a semiconductor device manufactured using the same are provided. According to one embodiment, a semiconductor device has a substrate and a plurality of bar type patterns on the substrate. The bar type patterns are substantially parallel to each other. At least one of the bar type patterns includes first and second ends and a middle part therebetween. The bar type patterns has an overhang at the first end thereof. The bar type patterns may be gate patterns, bit line patterns or active patterns.

20 Claims, 7 Drawing Sheets

Fig. 1

(Prior Art)

Fig. 2

(Prior Art)

INTEGRATED CIRCUIT LAYOUT AND A SEMICONDUCTOR DEVICE MANUFACTURED USING THE SAME

This application claims priority from Korean Patent Application No. 2002-31638, filed on Jun. 5, 2002, the contents of which are incorporated herein by reference in their entirety.

BACKGROUND OF THE INVENTION

1. Field of the Invention

The present invention relates to the field of semiconductor devices and, more particularly, to an integrated circuit layout and a semiconductor device manufactured using the same.

2. Description of the Related Art

Recently, the design rules of semiconductor devices have been dramatically decreased nearly to the resolution limit of photolithography light sources. One of the problems resulting from the decreased design rules is that specific portion of photoresist patterns may be significantly different from that of corresponding photo mask patterns in both shape and size thereof. For example, the width of a portion of bar type photoresist patterns may be unintentionally narrowed or widened. This phenomenon results from a proximity effect, which is well known in the industry. optical proximity correction (OPC) has been widely used to solve the problem by partially changing the shape and the size of photo mask patterns, thereby compensating the proximity effect.

Figure 1:
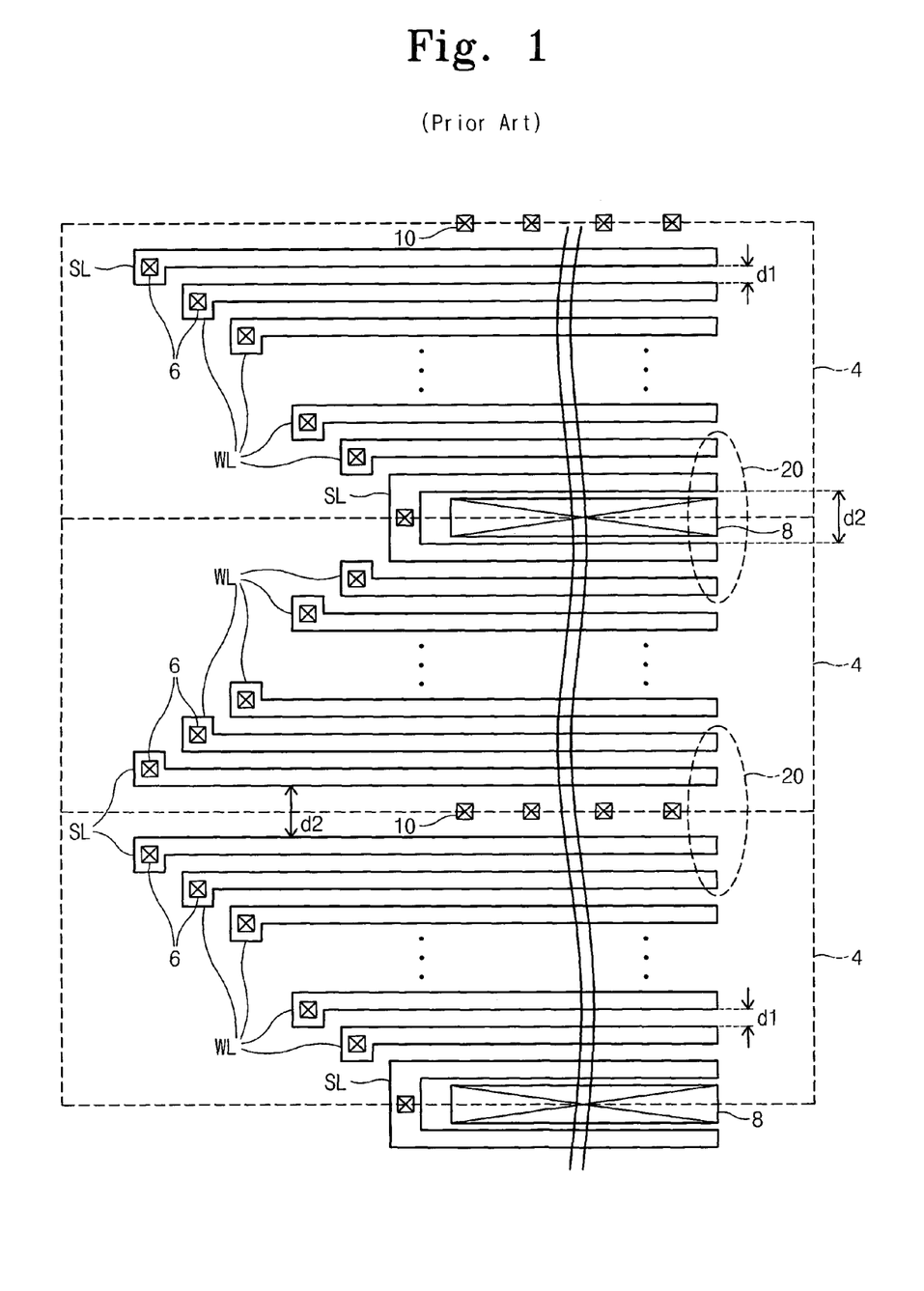
FIG. 1 is a schematic plan view illustrating a portion of a cell array of a conventional NAND type non-volatile memory device.

FIG. 1 is a schematic plan view illustrating a portion of a cell array of a conventional NAND type non-volatile memory device. Referring to FIG. 1, the cell array comprises a plurality of blocks 4 defined in a substrate (not shown). The blocks 4 are preferably arranged repeatedly and symmetrically throughout the cell array. Each of the blocks 4 comprises a plurality of gate patterns formed on the substrate. The gate patterns include selection lines SL and word lines WL. Each of the blocks includes a pair of selection lines SL and a plurality of word lines WL disposed between the pair of selection lines SL.

It is well known that the resolution limit (R) of photolithography technology is inversely proportional to a numerical aperture (NA) of a lens of photo equipment, while it is proportional to a wavelength (λ) of a photolithography light source and a process variable (k). This means that using a light source having a short wavelength may favorably decrease the resolution limit. Usually, due to the small size of word lines and bit lines of a non-volatile memory device, a deep ultraviolet light source is used as a light source for forming photoresist patterns thereof. One example of the deep ultraviolet light source is KrF, the wavelength of which is as short as 248 nanometers (nm). Meanwhile, especially when the size of a pattern is less than half of a wavelength of a light source, the proximity effect becomes serious dramatically. In case of a KrF light source, when the intended size of a pattern is 120 nm or less, the shape and size of a portion of a photoresist pattern may be seriously different from those of a layout pattern of a photo mask.

Each of the blocks 4 has a source line pattern 8 and bit line contact patterns 10 in common with neighboring blocks 4. In other words, at the interfaces between each pair of adjacent blocks 4, either the source line pattern 8 or the bit line contact patterns 10 are formed. The source line patterns 8 and the bit line contact patterns 10 are located between each pair of adjacent selection lines SL. As shown in FIG. 1, the distance d2 between each pair of adjacent selection lines SL is usually designed to be greater than the distance d1 between each pair of adjacent gate patterns of each of the blocks 4, thereby readily accommodating either the source line pattern 8 or the bit line contact patterns 10.

Each of the gate patterns has a first end, a second end and a middle part between the first and second ends. A gate contact pattern 6 is coupled to each of the second end, while each of the first ends is not coupled to any contact pattern. The width of the middle parts of the gate patterns is designed as narrow as a minimum feature size according to a design rule. As shown in FIG. 1, however, the second end of each of the gate patterns is wider than the middle part to accommodate the gate contact pattern 6. The size of the second end is usually two times or more of the minimum feature size.

It is also well known that the proximity effect has pattern dependency. That is to say, the influence of the proximity effect varies portion to portion of the same patterns. In case of the cell array of FIG. 1, the first ends of the gate patterns, at which the contact pattern 6 is not formed, is more seriously influenced by the proximity effect than the other portion of the patterns. As a result of the strong influence of the proximity effect thereon, the first ends of the gate patterns may have a lifting problem, which will be described in detail in conjunction with FIGS. 2 and 3.

Figure 2:
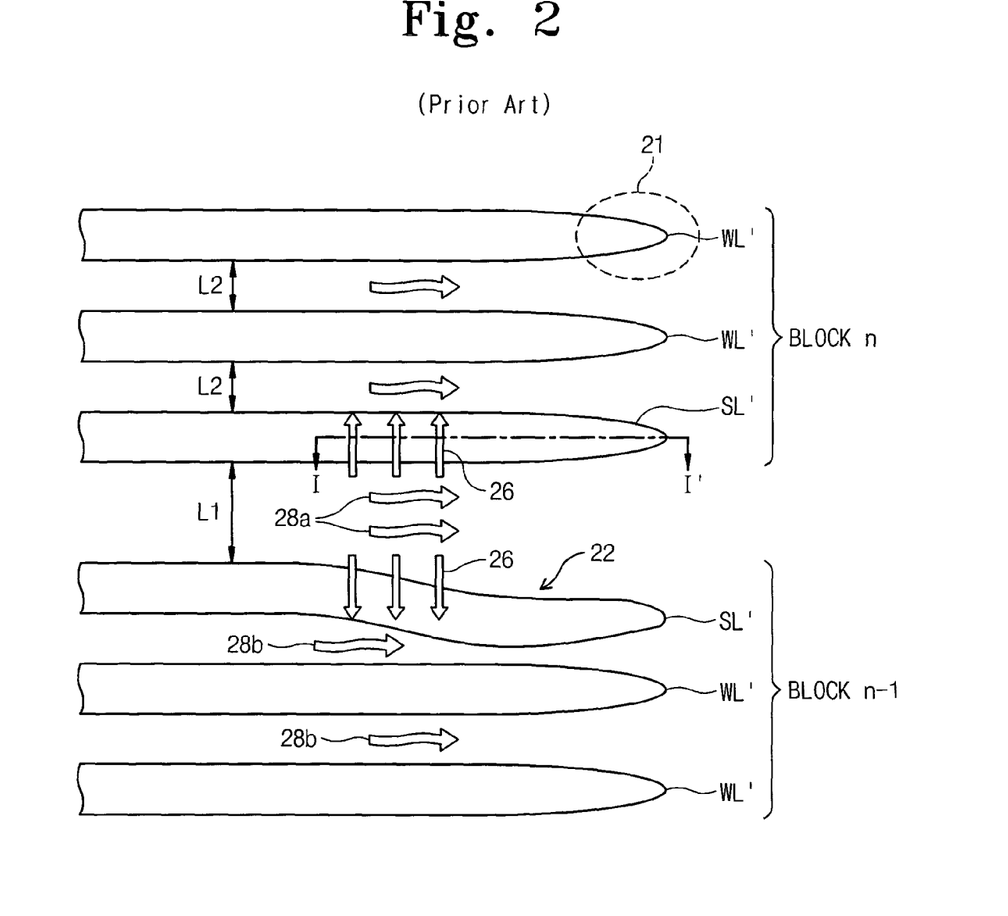
FIG. 2 is a plan view illustrating a photoresist patterns for forming the gate patterns of FIG. 1.
Figure 3:
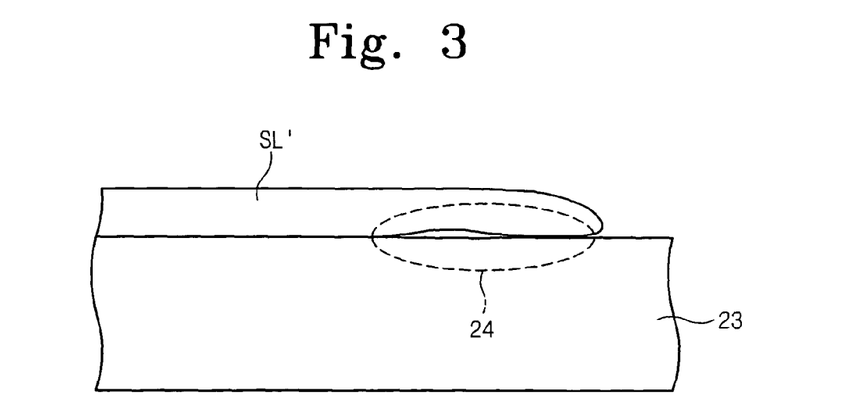
FIG. 3 is a cross-sectional view of the photoresist patterns taken along a line I–I' of FIG. 2.

FIG. 2 is a plan view illustrating a photoresist patterns for forming the gate patterns of FIG. 1. FIG. 2 is an enlarged plan view corresponding to a portion of the gate patterns around the first ends designated by reference numeral 20 in FIG. 1. FIG. 3 is a cross-sectional view of the photoresist patterns taken along line I–I' of FIG. 2.

Referring to FIG. 2, the photoresist patterns include word line photoresist patterns WL' and selection line photoresist patterns SL'. The word line photoresist patterns WL' are for forming the word lines WL, and the selection line photoresist patterns SL' are for forming the selection lines SL. The distance between each pair of adjacent selection line photoresist patterns SL' at the interface between two adjacent blocks is designated by reference L1, and the distance between each pair of adjacent photoresist patterns within each of the blocks is designated by reference L2. As shown in the drawings, the distance L1 is greater than the distance L2 to accommodate either the source line pattern 8 or the bit line contact patterns 10 as described earlier. As indicated by reference numeral 21 in FIG. 2, the photoresist patterns at the first ends may be significantly narrowed by the proximity effect, and the photoresist patterns may be partially lifted from a substrate 23 as indicated by reference numeral 24 in FIG. 3. The partial lifting may induce weak adhesion between the photoresist patterns and the substrate at the first ends.

Another problem at the first ends is a pattern shifting. That is to say, at the interface between adjacent pair of block n and block n-1, a portion of the selection line photoresist patterns SL' may be undesirably shifted from the originally intended position as indicated by reference numeral 22 in FIG. 2. The pattern-shifting problem results from the above-mentioned weak adhesion as well as a force 26 induced vertically to the selection line photoresist patterns SL'. The vertical force 26 results from a development process of photolithography for forming the photoresist patterns. In other words, during the development process, there are flows 28a, 28b of developing chemicals along spaces between each pair of the photoresist patterns. Reference numeral 28a indicates the flows between the each pair of adjacent selection line photoresist patterns SL', and reference numeral 28b indicates the flows between the each pair of adjacent photoresist patterns within each of the blocks. Due to the difference between the distance L1 and the distance L2, the velocity of the flows 28a is different from that of the flows 28b, thereby generating the vertical force 26.

SUMMARY

Thus, among other things, the present invention provides an integrated circuit layout. For example, the present invention provides a semiconductor device with a bar type patterns to substantially reduce the problems described above, for example, the proximity effect or the pattern-shifting problem.

According to one embodiment, a semiconductor device comprises a substrate and a plurality of bar type patterns formed on the substrate. The bar type patterns are substantially parallel to each other. Each of the bar type patterns includes first and second ends and a middle part therebetween. At least one of the bar type patterns has an overhang at the first end thereof.

According to an aspect of the present invention, the semiconductor device further comprises at least one contact pattern. The contact pattern is coupled to the second end of the at least one of the bar type patterns. The overhang extends from the first end to at least one direction substantially perpendicular to the bar type patterns. Alternatively, the overhang extends from the first end to both directions substantially perpendicular to the bar type patterns.

According to another embodiment of the present invention, almost every other bar type pattern may have the overhang at the first end thereof. The distance between a pair of adjacent middle parts is approximately the same as the distance between a pair of adjacent overhangs. The bar type patterns may be gate patterns, bit line patterns or active patterns.

According to another aspect of the present invention, a semiconductor device comprises a substrate a plurality of unit areas defined in the substrate. Each of the unit areas includes a plurality of bar type patterns formed on the substrate. The bar type patterns are substantially parallel to each other. Each of the bar type patterns includes first and second ends and a middle part therebetween. The bar type patterns are substantially equally spaced in each of the unit areas. Each of two outermost ones of the bar type patterns in each of the unit areas has an overhang at the first end thereof.

According to yet another embodiment, the semiconductor device further comprises at least two contact patterns in each of the unit areas. The contact patterns are coupled to the second ends of the two outermost ones of the bar type patterns in each of the unit areas. The overhangs extend from the first end to a direction substantially perpendicular to the bar type patterns. The overhangs protrude into the interface between two adjacent unit areas. Alternatively, the overhangs extend from the first end to both directions substantially perpendicular to the bar type patterns.

According to still another embodiment, the distance between each pair of adjacent middle parts in each of the unit areas is a first distance. The distance between each pair of adjacent overhangs at the interface between two adjacent unit areas is a second distance. The first distance and the second distance may be approximately the same. The distance between a pair of adjacent middle parts at the interface between two adjacent unit areas is a third distance. The third distance is greater than the first distance and the second distance. Every other bar type pattern in each of the unit areas may have an overhang at the first end thereof. The bar type patterns may be gate patterns, bit line patterns or active patterns. If the bar type patterns are gate patterns, the two outermost ones of the bar type patterns in each of the unit areas are a ground selection line and a string selection line, and the bar type patterns between the two outermost ones thereof in each of the unit areas are word lines.

BRIEF DESCRIPTION OF THE DRAWINGS

Other features of the present invention will be more readily understood from the following detailed description of specific embodiments thereof when read in conjunction with the accompanying drawings, in which.

DETAIL DESCRIPTION

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the concept of the invention to those skilled in the art. In the drawings, the geometrical magnitude of elements may be exaggerated for clarity. In the discussion and claims herein, it will also be understood that when a layer is referred to as being "on" another layer or a substrate, it can be directly on the other layer or the substrate, or intervening layers may also be present.

Figure 4:
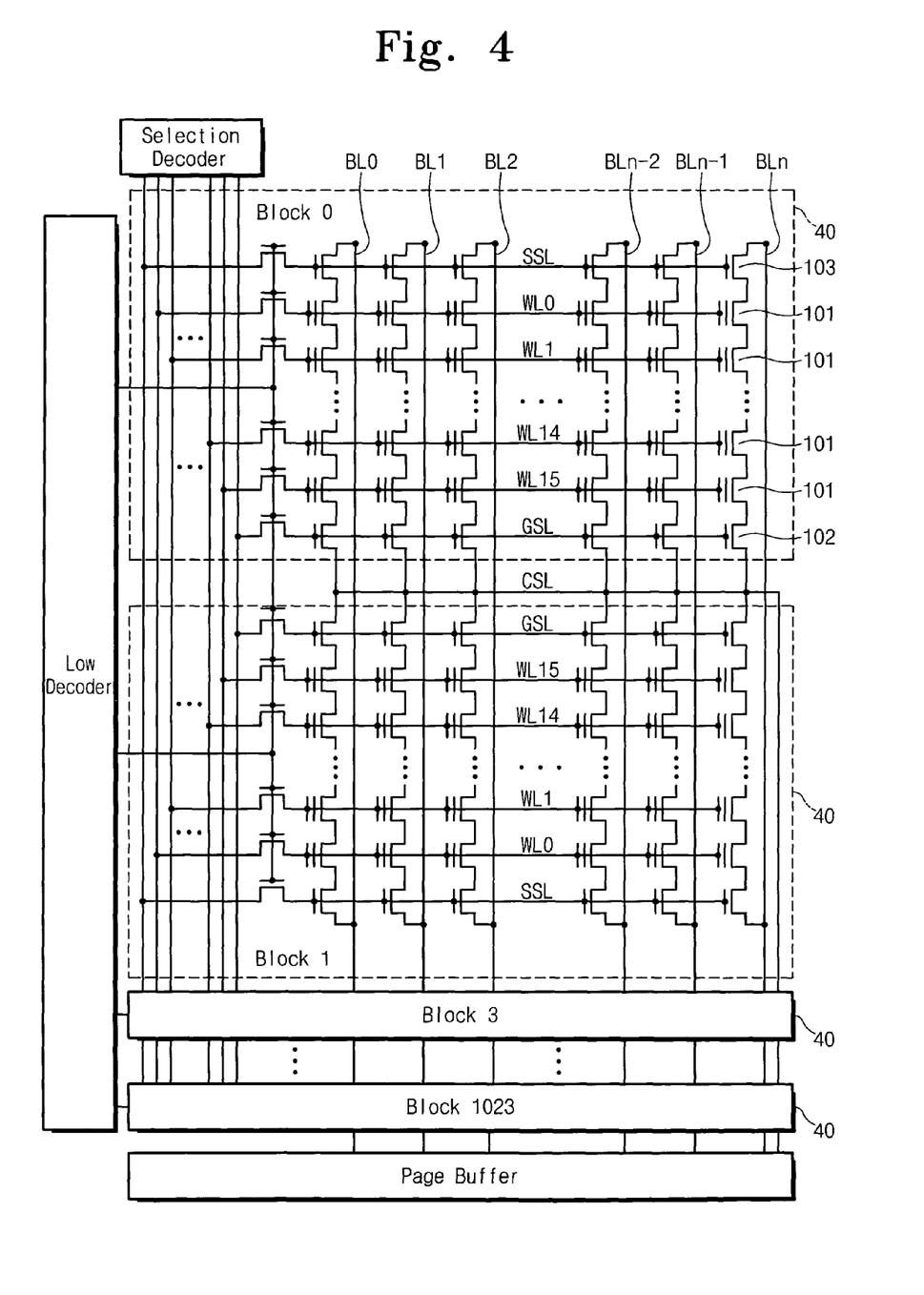
FIG. 4 is a schematic circuit diagram illustrating a cell array of a NAND type non-volatile memory device according to the present invention.

FIG. 4 is a schematic circuit diagram illustrating a cell array of a NAND type non-volatile memory device according to an embodiment of the present invention. Referring to FIG. 4, the cell array comprises a plurality of blocks 40, each of which has a plurality of cell strings. Each of the cell strings includes a ground selection transistor 102, a plurality of cell transistors 101 and a string selection transistor 103, which are connected to each other in series. The cell array further comprises ground selection lines GSL, word lines WL and string selection lines SSL, which are disposed across the cell strings. The ground selection lines GSL are connected to the gate electrodes of the ground selection transistors 102. The string selection lines SSL are connected to the gate electrodes of the string selection transistors 103. The word lines WL are connected to the gate electrodes of the cell transistors 101. The ground selection transistors 102 of one of the blocks 40 has its source electrode in common with adjacent one of the blocks 40, thereby constituting a common source line CSL. The cell strings are connected to a page buffer through bit lines BL. The cell array further comprises a low decoder and a selection decoder.

Figure 5:
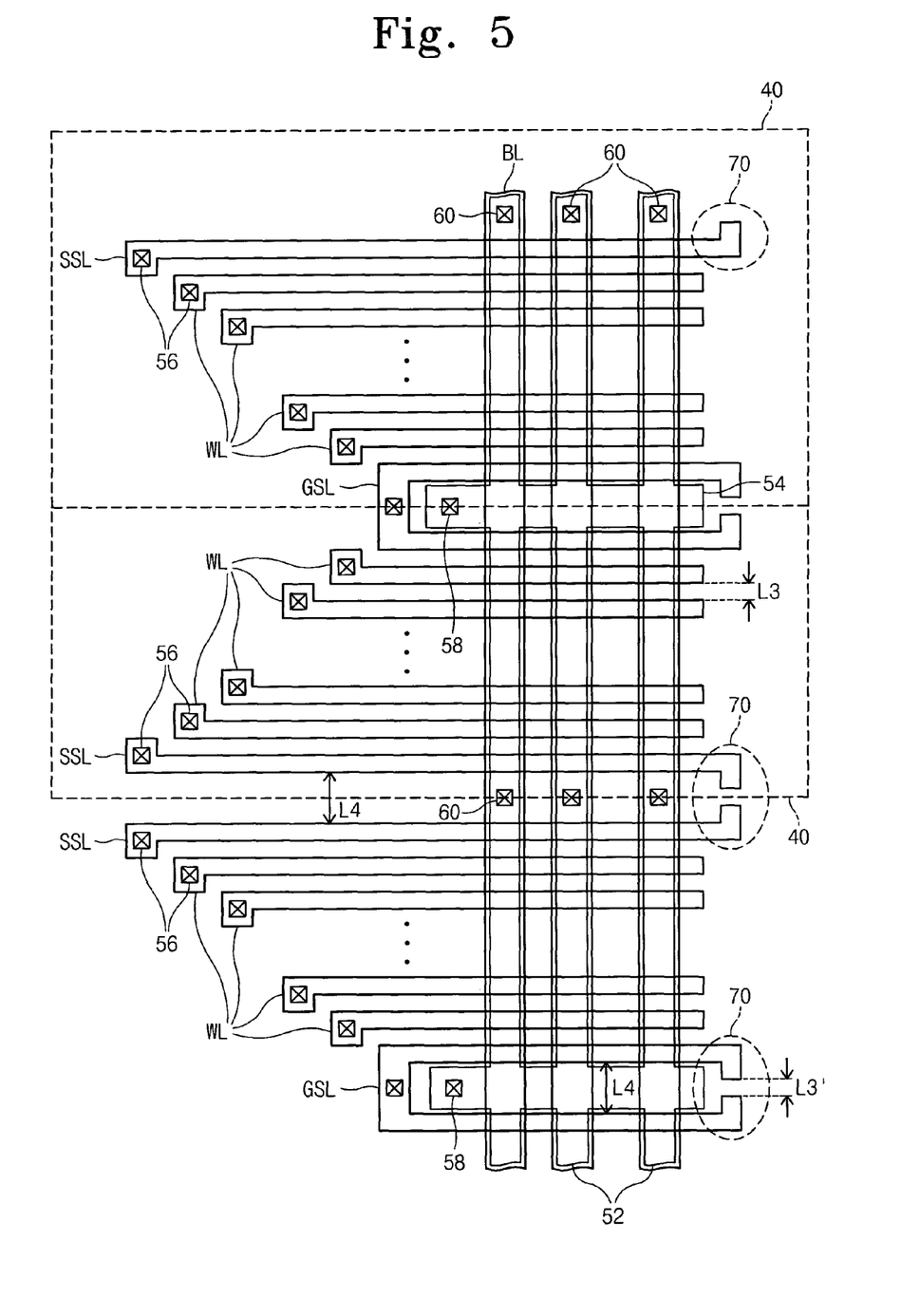
FIG. 5 is a schematic plan view illustrating a portion of a plurality of blocks of FIG. 4, according to one embodiment of the present invention.

FIG. 5 is a schematic plan view illustrating a portion of the plurality of blocks 40 of FIG. 4, according to one embodiment of the present invention. Referring to FIG. 5, the blocks 40 are defined in a substrate (not shown). The blocks 40 are arranged repetitiously and symmetrically throughout the cell array. First active regions 52 and second active regions 54 are defined by forming an isolation region (not shown) in the substrate. First active regions 52 are disposed across the second active regions 54. The blocks 40 comprise a plurality of bar type gate patterns formed on the substrate. The plurality of bar type gate patterns include the ground selection lines GSL, the string selection lines SSL and the word lines WL. The gate patterns are disposed across the first active region 52. Each of the blocks 40 includes a pair of the selection lines, i.e. one of the ground selection lines GSL and one of the string selection lines SSL. The word lines WL are disposed between the selection lines GSL and SSL. The bar type patterns are preferably substantially parallel to each other.

Each of the blocks 40 has a source contact pattern 58 and bit line contact patterns 60 in common with neighboring blocks 40. In other words, at the interfaces between each pair of adjacent blocks 40, either the source contact pattern 58 or the bit line contact patterns 60 is formed. The source contact patterns 58 are formed between each pair of adjacent ground selection lines GSL. The bit line contact patterns 60 are formed between each pair of adjacent string selection lines SSL. Bit lines BL are formed on the first active regions 52 and connected to the first active region 52 through the bit line contact patterns 60. Each of the second active regions 54 is positioned between each pair of adjacent ground selection lines GSL to be connected to the source contact patterns 58. Ion implantation is performed to form impurity-doped regions at the first and the second active regions 52, 54. The second active regions 54 act as the common source lines CSL. Alternatively, the common source lines CSL may be formed by conductive patterns of tungsten or a metal silicide instead of the second active regions 54.

Each of the gate patterns has a first end, a second end and a middle part therebetween. Preferably, a gate contact pattern 56 is coupled to each of the second ends, while each of the first ends is not coupled to any contact pattern. The widths of the middle part of the gate patterns are designed as narrow as a minimum feature size according to a design rule. As shown in FIG. 5, the second end of each of the gate patterns is, however, wider than the middle part to accommodate the gate contact pattern 56.

Figure 6:
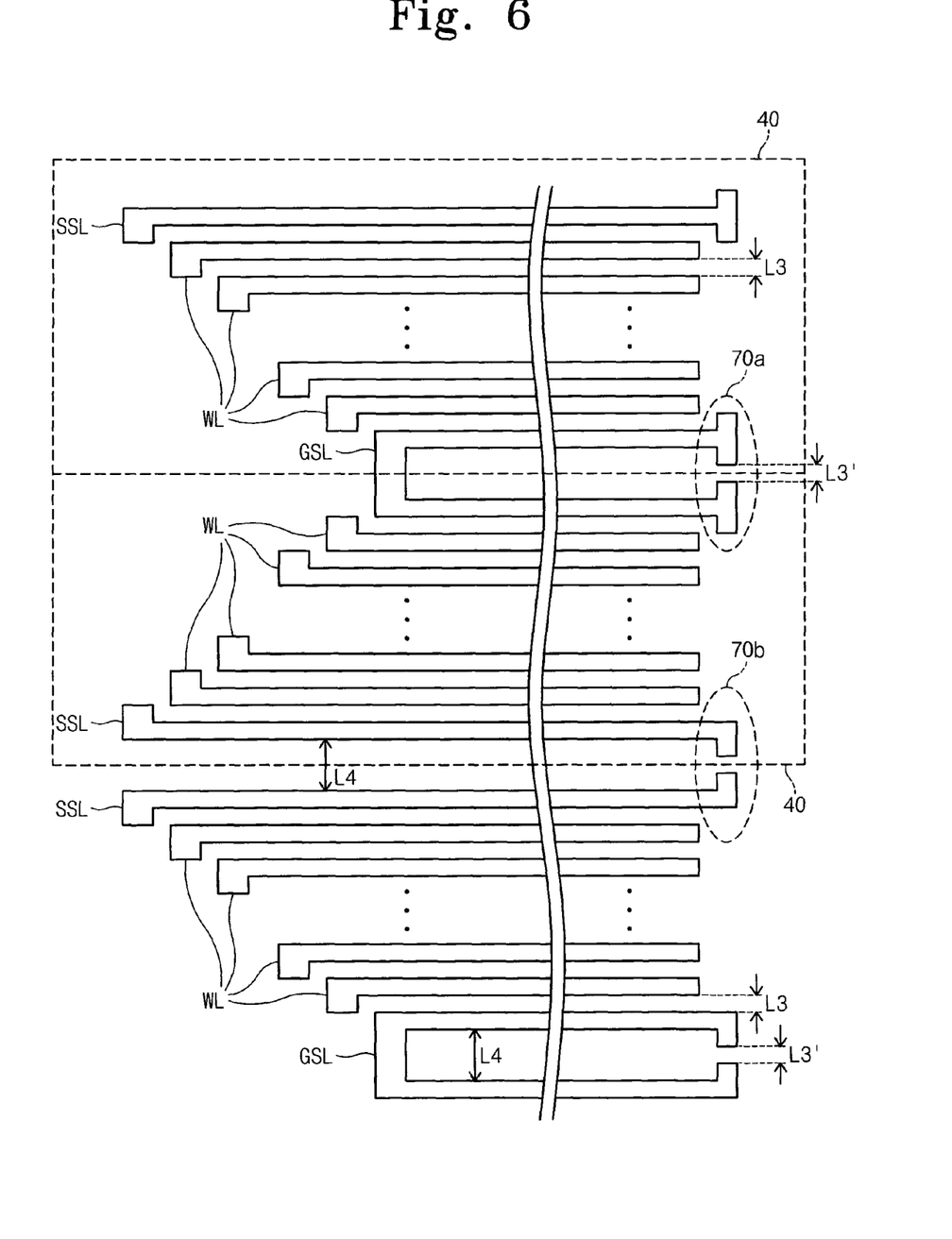
FIG. 6 is a schematic plan view illustrating a portion of a plurality of blocks of FIG. 4, according to another embodiment of the present invention.

Some portions of the bar type patterns are substantially equally spaced in the blocks 40, as identified by a distance L3 in FIGS. 5–6. On the other hand, a distance L4 between the adjacent selection lines, e.g., SSL or GSL, at the interface between two adjacent blocks 40 is greater than the distance L3, e.g., between the word line WL and the ground selection line GSL to accommodate either the source line pattern 58 or the bit line contact patterns 60.

Each of two outermost ones of the bar type patterns in the blocks 40 has an overhang at the first end thereof as indicated by reference numeral 70. That is, the two selection lines of each block 40 has an overhang at the first ends, where the contact pattern 56 is not formed. The overhangs extend from the first end to a direction substantially perpendicular to the bar type patterns. For example, the overhangs can extend toward the interface between two adjacent blocks 40 or the selection lines GSL, SSL in the adjacent blocks 40. Also, the overhangs can extend toward the word lines WL. Alternatively, the overhangs may protrude into the center axes of the blocks 40 opposite to the direction of the overhang. A distance L3' between a pair of adjacent overhangs at the interface between two adjacent blocks 40 may be approximately the same as the distance L3. Alternatively, the distance L3' may be different from the distance L3, but narrower than the distance L4. The overhangs compensate the proximity effect at the first ends, thereby avoiding the lifting problem. Moreover, the velocity difference of the flows of developing chemicals along spaces between adjacent photoresist patterns for forming the gate patterns is significantly reduced. Thus, the pattern-shifting problem can be avoided.

FIG. 6 is a schematic plan view illustrating a portion of a plurality of blocks of FIG. 4, according to another embodiment of the present invention. FIG. 6 shows only gate patterns for simplicity. Referring to FIG. 6, the gate patterns shown are the same as those of FIG. 5 except for the shape of the overhangs. Namely, a portion of the overhangs extends from the first end to both directions substantially perpendicular to the bar type patterns, as indicated by reference numeral 70a. The other portion of the overhangs preferably has the same shapes as those of FIG. 5, as indicated by reference numeral 70b. The overhangs indicated by reference numeral 70b protrude either into the interface between two adjacent blocks 40, as described in the drawing or into the center axes of the blocks 40. Alternatively, all of the overhangs may have the shape indicated by the numerical reference 70a. Even though there are two kinds of overhangs, the distance L3' between each pair of adjacent overhangs at the interface between two adjacent blocks 40 is preferably approximately the same as the distance L3 between each pair of adjacent middle parts of the gate patterns. Alternatively, the distance L3' may be different from the distance L3, but narrower than the distance L4.

Figure 7:
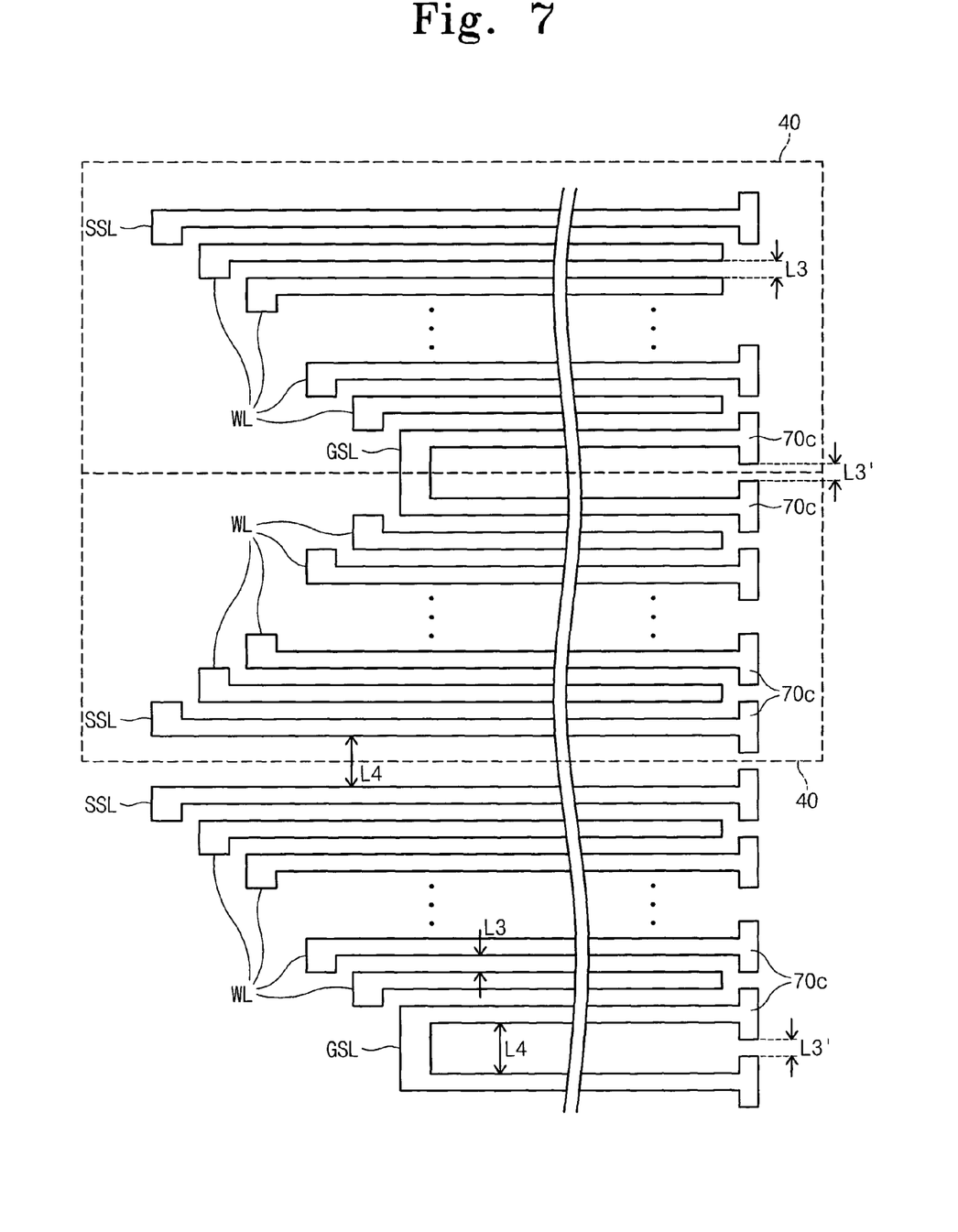
FIG. 7 is a schematic plan view illustrating a portion of a plurality of blocks of FIG. 4, according to another embodiment of the present invention.

FIG. 7 is a schematic plan view illustrating a portion of a plurality of blocks of FIG. 4, according to another embodiment of the present invention. FIG. 7 shows only gate patterns for simplicity. Referring to FIG. 7, the gate patterns are the same as those of FIG. 5 except that every second one of the word lines WL in each of the blocks 40 has also overhangs at the first end thereof, and all of the overhangs extend from the first end to both directions substantially perpendicular to the bar type patterns, as indicated by reference numeral 70c. Alternatively, the overhangs may have the shape of the overhangs in FIG. 5. It is preferable that the distance L3' between each pair of adjacent overhangs be approximately the same as the distance L3 between each pair of adjacent middle parts of gate patterns. Alternatively, the distance L3' may be different from the distance L3, but narrower than the distance L4.

Figure 8:
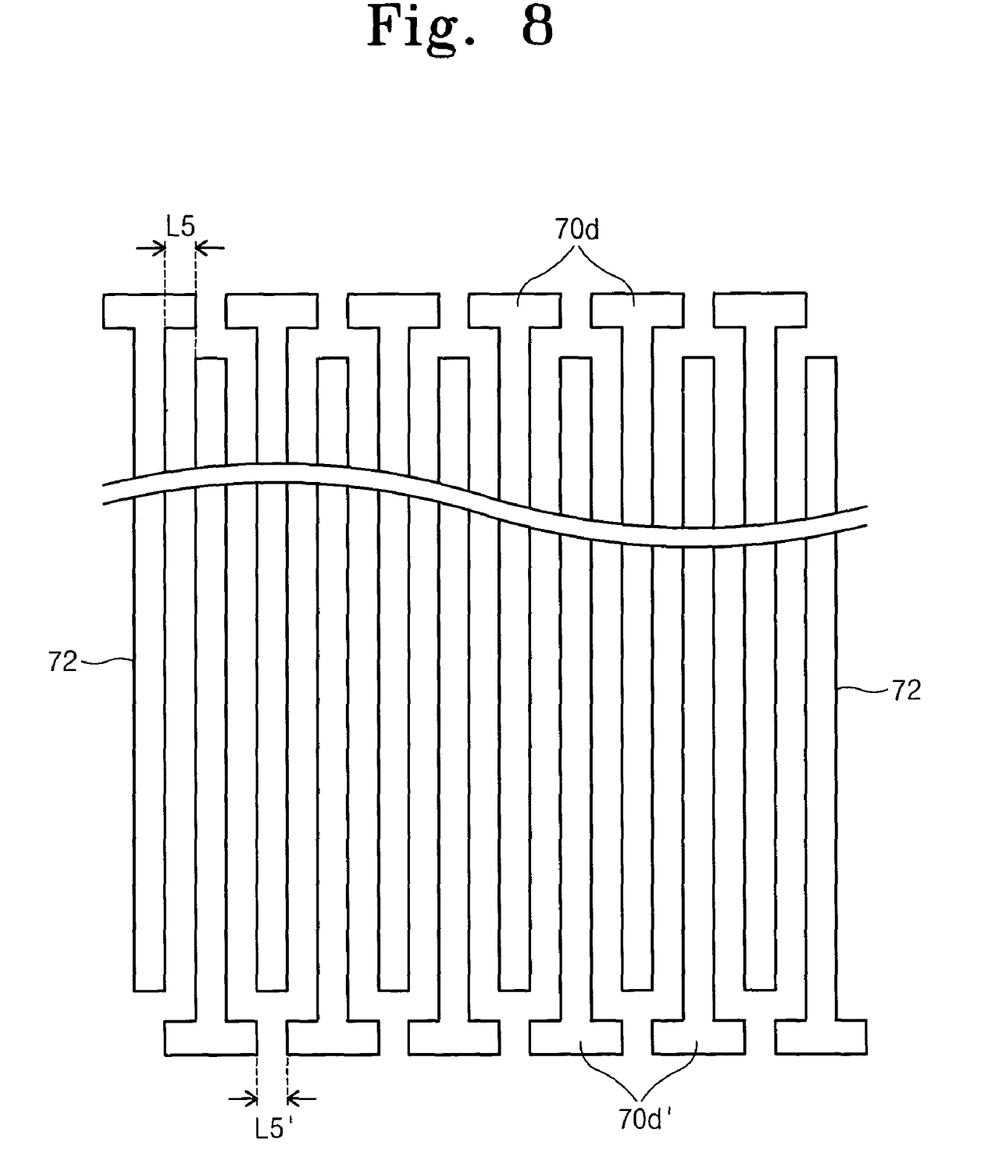
FIG. 8 is a schematic plan view illustrating a bar type patterns according to another embodiment of the present invention.

FIG. 8 is a schematic plan view illustrating a bar type patterns 72 according to another embodiment of the present invention. The patterns 72 can be the first active region 52 or the bit lines BL of FIG. 5. Each of the bar type patterns 72 includes top and bottom ends and a middle part therebetween. The bar type patterns 72 are substantially parallel to each other and substantially equally spaced such that the distance between each pair of adjacent middle parts thereof is approximately the same. Every second one of the bar type patterns 72 has a first group of overhangs at top end thereof, as indicated by reference numeral 70d. The other bar type patterns 72 has a second group of overhangs at the bottom end thereof, as indicated by reference numeral 70d'. It is preferable that the distance L5' between each pair of any adjacent overhangs be approximately the same as the distance L5 between each pair of adjacent middle parts of the bar type patterns 72.

According to the present invention, the overhangs can compensate the proximity effect, thereby substantially preventing the unintentionally narrowed ends of the patterns. Moreover, the velocity difference of the flows of developing chemical can also be significantly reduced by the overhangs. Thus, the pattern-shifting problem can be prevented.

While exemplary embodiments of the present invention have been shown and described herein, it will be understood by those skilled in the art that various changes in form and details may be made therein without departing from the spirit and scope of the invention. For example, overhangs can be of different shapes than the shapes shown in the embodiments described above.

What is claimed is:

1. A semiconductor device comprising:
a substrate; and
a plurality of bar type patterns formed on the substrate, the plurality of bar type patterns substantially in parallel with each other and extending in a longitudinal direction, each of the plurality of bar type patterns including a first end, a second end, and a middle part therebetween, a spacing between adjacent middle parts defines a nominal distance therebetween in a substantially perpendicular direction,
wherein alternate ones in a first group of the bar type patterns have an overhang at the first end thereof and wherein alternate ones in a second group of the bar type patterns have an overhang at the second end thereof, the alternate ones of the bar type patterns of the first and second groups interleaving one another, and
wherein at least one of the bar type patterns has a contact pattern at the second end thereof.

2. The semiconductor device of claim 1, wherein the overhang extends from the first end in at least one direction substantially perpendicular to the longitudinal direction.

3. The semiconductor device of claim 1, wherein the overhang extends from the first end in both directions substantially perpendicular to the longitudinal direction.

4. The semiconductor device of claim 1, wherein the distance between a pair of adjacent middle parts is approximately the same as the distance between a pair of adjacent overhangs.

5. The semiconductor device of claim 1, wherein the bar type patterns are gate patterns, bit line patterns or active patterns.

6. The semiconductor device of claim 1, wherein adjacent ones of the bar type patterns are substantially equally spaced from one another.

7. A semiconductor device comprising:
a substrate; and
a plurality of unit areas defined in the substrate,
wherein each of the unit areas includes a plurality of bar type patterns formed on the substrate, the bar type patterns extending in a longitudinal direction, wherein at least one of the bar type patterns includes first and second ends and a middle part therebetween, and wherein two outermost ones of the bar type patterns in the unit areas has an overhang at the first end thereof and a contact pattern at the second end,
wherein each pair of adjacent middle parts in the unit areas defines a first distance therebetween in a substantially perpendicular direction, wherein each pair of adjacent overhangs at the interface between two adjacent unit areas defines a second distance therebetween in the substantially perpendicular direction, wherein the first distance and the second distance are different or approximately the same as each other,
wherein a pair of adjacent middle parts at an interface between two adjacent unit areas defines a third distance in the substantially perpendicular direction, and wherein the third distance is greater than the first distance and the second distance.

8. The semiconductor device of claim 7, wherein the bar type patterns are substantially parallel to each other, and substantially equally spaced in each of the unit areas.

9. The semiconductor device of claim 7, which further comprises at least two contact patterns in each of the unit areas, wherein the contact patterns are coupled to the second ends of the two outermost ones of the bar type patterns in each of the unit areas.

10. The semiconductor device of claim 7, wherein the overhangs extend from the first end in a direction substantially perpendicular to the longitudinal direction.

11. The semiconductor device of claim 10, wherein the overhangs extend toward the interface between two adjacent unit areas.

12. The semiconductor device of claim 7, wherein the overhangs extend from the first end in both directions substantially perpendicular to the longitudinal direction.

13. The semiconductor device of claim 7, wherein every other bar type pattern in each of the unit areas has an overhang at the first end thereof.

14. The semiconductor device of claim 7, wherein the bar type patterns are gate patterns, bit line patterns or active patterns.

15. The semiconductor device of claim 14, wherein the bar type patterns are gate patterns, and wherein the two outermost ones of the bar type patterns in each of the unit areas are a ground selection line and a string selection line.

16. The semiconductor device of claim 15, wherein the bar type patterns between the two outermost ones thereof in each of the unit areas are word lines.

17. A semiconductor device, comprising:
a substrate having first and second plurality of conductive patterns formed on the substrate, the first and second plurality of conductive patterns substantially parallel to each other and extending in a longitudinal direction,
the first plurality of conductive patterns including a pair of first outermost patterns, the pair of first outermost patterns having one or more first conductive line patterns disposed therebetween, the first plurality of conductive patterns defining a first space therebetween in a direction substantially perpendicular to the longitudinal direction,
the second plurality of conductive patterns including a pair of second outermost patterns, the pair of second outermost patterns having one or more second conductive line patterns disposed therebetween, the second plurality of conductive patterns defining a second space therebetween in the substantially perpendicular direction,
one of the first outermost patterns and one of the second outermost patterns being adjacent to each other and defining a third space therebetween in the substantially perpendicular direction, the adjacent first and second outermost patterns each including first and second ends, the first end having an overhang, the second end having a contact pattern, each overhang extending into the third space and facing each other, the third space being larger than either of the first and second spaces.

18. The semiconductor device of claim 17, wherein the first plurality of conductive patterns are substantially equally spaced from each other and wherein the second plurality of conductive patterns are substantially equally spaced from each other.

19. The semiconductor device of claim 17, wherein the one of the first outermost patterns and the one of the second outermost patterns are connected to one another at the second end.

20. The semiconductor device of claim 19, wherein the one of the first outermost patterns and the one of the second outermost patterns are connected with the contact pattern at the second end.

* * * * *